(12) United States Patent
Dun et al.

(10) Patent No.: US 11,456,389 B2
(45) Date of Patent: Sep. 27, 2022

(54) DEEP TRENCH SURROUNDED MOSFET WITH PLANAR MOS GATE

(71) Applicants: Champion Microelectronic Corp., Hsinchu (TW); Yutechnix, Inc., Saratoga, CA (US)

(72) Inventors: Haiping Dun, Fremont, CA (US); Hung-Chen Lin, Hsinchu (TW)

(73) Assignee: Champion Microelectronic Corp., Hsinchu (TW)

(*) Notice: Subject to any disclaimer, the term of this patent is extended or adjusted under 35 U.S.C. 154(b) by 101 days.

(21) Appl. No.: 16/939,022

(22) Filed: Jul. 26, 2020

(65) Prior Publication Data
US 2020/0373438 A1    Nov. 26, 2020

Related U.S. Application Data

(62) Division of application No. 15/853,794, filed on Dec. 23, 2017, now Pat. No. 10,770,599.

(60) Provisional application No. 62/439,020, filed on Dec. 24, 2016.

(51) Int. Cl.
| | | |
|---|---|---|
| *H01L 29/872* | (2006.01) | |
| *H01L 29/78* | (2006.01) | |
| *H01L 29/06* | (2006.01) | |
| *H01L 29/70* | (2006.01) | |

(52) U.S. Cl.
CPC ...... *H01L 29/8725* (2013.01); *H01L 29/0692* (2013.01); *H01L 29/70* (2013.01); *H01L 29/7806* (2013.01); *H01L 29/7813* (2013.01)

(58) Field of Classification Search
CPC combination set(s) only.
See application file for complete search history.

(56) References Cited

U.S. PATENT DOCUMENTS

| | | |
|---|---|---|
| 6,710,403 B2 | 3/2004 | Sapp |
| 7,713,822 B2 | 5/2010 | Thorup et al. |
| 8,461,646 B2 | 6/2013 | Kao |
| 8,981,465 B2 | 3/2015 | Chen |
| 2003/0160262 A1* | 8/2003 | Kitada ............... H01L 29/0619 257/E29.136 |
| 2004/0070002 A1 | 4/2004 | Kurosaki et al. |

(Continued)

OTHER PUBLICATIONS

Chen et al.; High-Voltage TMBS Diodes Challenge Planar Schottkys, Power Electronics Technology, Oct. 2006, pp. 22-32.

(Continued)

*Primary Examiner* — Julio J Maldonado
*Assistant Examiner* — Mohammad A Rahman
(74) *Attorney, Agent, or Firm* — Cheng Intellectual Property Group

(57) ABSTRACT

Apparatus and other embodiments associated with high speed and high breakdown voltage MOS rectifier are disclosed. A Junction All Around structure, where a deep trench structure surrounds and encloses a P-N junction or a MOS structure, is created and applied in various rectifiers. In one embodiment, multiple deep trenches in concentric ring circles enclosed several horizontal P-N junctions in concentric ring circles. In another embodiment, an enclosed deep trench in ring circle surrounds a horizontal P-N junction, which results in a planar N-channel MOS during forward bias. This structure can be extended to multiple deep trenches with associated horizontal P-N junctions.

10 Claims, 9 Drawing Sheets

(56) References Cited

U.S. PATENT DOCUMENTS

| | | | | |
|---|---|---|---|---|
| 2005/0167742 | A1* | 8/2005 | Challa | H01L 29/66734 |
| | | | | 257/E29.264 |
| 2007/0187753 | A1* | 8/2007 | Pattanayak | H01L 29/7813 |
| | | | | 257/E29.136 |
| 2013/0009272 | A1* | 1/2013 | Sakurai | H01L 27/13 |
| | | | | 257/496 |

OTHER PUBLICATIONS

Mehrotra et al.; Trench MOS Barrier Schottky (TMBS) Rectifier: A Schottky Rectifier with Higher Than Parallel Plane Breakdown Voltage, Solid-State Electronics, 1995, pp. 801-806, vol. 38.

Hsu et al.; Innovative Designs Enable 300-V TMBS with Ultra-low On-state Voltage and Fast Switching Speed, IEEE Proceedings of the 23rd International Symposium on Power Semiconductor Devices & IC's, May 2011, pp. 80-83.

* cited by examiner

DEEP TRENCH SURROUNDED MOSFET WITH PLANAR MOS GATE

CROSS REFERENCE

This application is a divisional application of U.S. patent application with Ser. No. 15/853,794 filed on Dec. 23, 2017, the entire content of which is hereby incorporated by reference as if fully set forth herein, under 35 U.S.C. § 120; which claims priority to U.S. Provisional Application with Ser. No. 62/439,020, filed on Dec. 24, 2016, and is a Continuation-In-Part of application with Ser. No. 15/256, 531, filed on Sep. 3, 2016, titled "High Speed Schottky Rectifier," each of which are hereby incorporated by reference herein their entire contents.

FIELD OF INVENTION

This disclosure generally relates to semiconductor power device technology. More specifically, it is related to structures and methods for forming a high switching MOS device for high voltage application.

DESCRIPTION OF THE RELATED ART

High voltage rectifiers have wide range of potential industrial applications, including medical imaging, transportation industry (e.g. high speed rail and aircraft), and particulate emission control in power generations. Schottky rectifiers are popular for high-frequency applications due to their high performance characteristics including low forward voltage at reasonable leakage current, and small reverse recovery time. Their low forward voltage improves power consumption and power supply efficiency, where they are ideal for the output stages of switching power supplies. Their switching speed is faster than a comparable pn-junction diode, but they have the drawbacks such as high leakage and limited breakdown voltage range. Thus, silicon-based Schottky rectifiers are limited to applications with operating voltage below 300 V.

Techniques used to increase breakdown voltage have resulted in increases in the Schottky rectifier's forward voltage and reverse leakage current, and thus reduce its switching speed. For example, it is typical to use guard ring structure, high-resistivity silicon epitaxial layer and high Schottky barrier height to increase higher breakdown voltage. However, these techniques tend to use thick epitaxial layer while lowering current density, and thus lose its advantage of high switching speed and low forward-voltage drop. In addition, Trench MOS Barrier Schottky (TMBS) structure rectifier has been used for higher voltage application, but it is still not able to overcome the breakdown and leakage current problems for very high voltage application, for example, 1,000V or higher. Accordingly, there exists a need for a rectifier for very high voltage application without the above limitations or drawbacks.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

Various embodiments of apparatus for high switching speed and high voltage application rectifiers are contemplated. In one embodiment, a device comprises two n-type semiconductor layers, and a p-type semiconductor layer. The first layer is a $N^+$ substrate and the second layer on top of the first layer is a $N^-$ epitaxial layer. The third layer is a p-type semiconductor layer on top of the $N^-$ epitaxial layer. A metal layer is deposed above the p-type semiconductor layer. At least two enclosed deep trenches in concentric continuous ring circles acting as operating (or active) trenches are etched from the top of the p-type semiconductor layer down to the interface of the $N^+$ substrate and the $N^-$ epitaxial layer. The first deep trench has smaller radius than the second deep trench. Both deep trenches have oxide coating on their sidewalls and bottom surfaces, and a polysilicon layer filling their centers and connected to the metal layer for operation.

Two sets of $N^+$ source regions in ring circles are deposed in the upper part of the p-type semiconductor layer and on both inner-side and outer-side of the first and the second enclosed deep trenches. The first set of $N^+$ source regions correspond to the first enclosed deep trench, and the second set of $N^+$ source regions correspond to the second enclosed deep trench. As a result, the outer-side N+ ring circle of the first set has smaller radius than the inner-side N+ ring circle of the second set. The outer-side N+ ring circle of the first set is spaced apart with some distance from the inner-side N+ ring circle of the second set, thus leaving the p-type semiconductor between them.

BRIEF DESCRIPTION OF THE DRAWINGS

The present disclosure is illustrated by way of example, and not by way of limitation in the figures of the accompanying drawings and in which like reference numerals refer to similar elements and in which.

DETAILED DESCRIPTION

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Figure 1A:
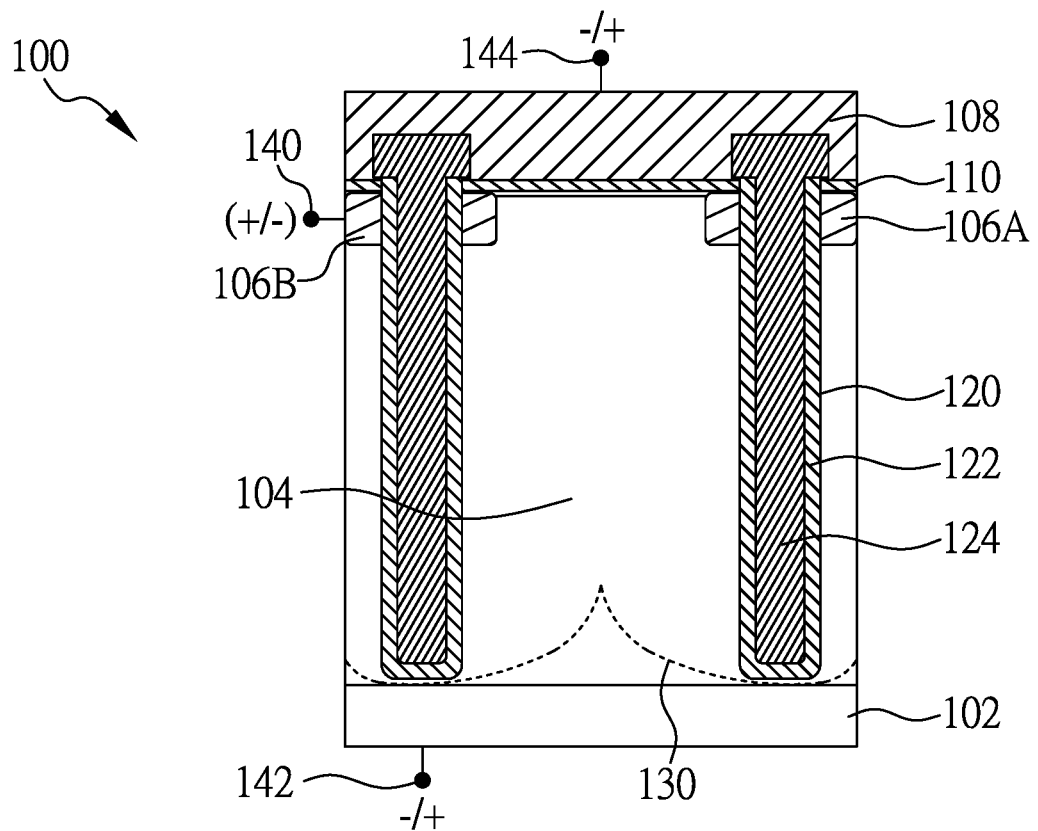
FIG. 1A illustrates a cross-sectional view of a deep trench surrounded rectifier, according to one or more embodiments.

FIG. 1A illustrates a cross-sectional view of a deep trench surrounded rectifier (a Schottky diode) 100, according to an embodiment. The deep trench isolated rectifier has a N type epitaxial drift region 104 above a highly doped N$^+$ substrate 102. The doping concentration of N$^-$ epitaxial region 104 is about $1\times10^{14}$/cm$^3$ and the concentration of N$^+$ substrate layer 102 is about $1\times10^{18}$/cm$^3$. The top portion of N$^+$ substrate 102 may act as a field stop to reduce leakage current during reverse bias. Two P$^+$ edge contact regions 106A and 106B (collectively called 106) are each created by implant on two upper corners of the N$^-$ epitaxial drift region 104. The doping concentration of P$^+$ edge contact regions 106 is between $1\times10^{15}$ and $1\times10^{18}$/cm$^3$. In one or more embodiments, an enclosed deep trench structure 120 is etched around the periphery of the rectifier device 100 extending from the top surface of N$^-$ epitaxial drift region 104 through the P$^+$ edge contact regions 106. The depth of the deep trench structure 120 can be close to the bottom of N$^-$ epitaxial drift region 104, and may extend into N$^+$ substrate layer 102. The sidewall and bottom surface of the deep trench structure 120 are coated with grown thermal or CVD deposited oxide 122, and the remaining of trench is filled with polysilicon 124. The bottom of trenches 120 has round corners to reduce edge field effect, and thicker oxide 122 allows better corner control. A metal layer 108 is deposited on top of both the P$^+$ edge contact regions 106 and N$^-$ epitaxial region 104, and thus the metal-semiconductor interfaces result in a merged Schottky barrier 110 with PiN diode in parallel with MSP to serve as a rectifier. PiN diode is known as "P-intrinsic-N" diode. 'P' refers to 106 edge contact, "Intrinsic" refers to N– epitaxial drift region 104, and 'N' refers to N+ substrate 102. This structure of P, N–, and N+ form a diode. Furthermore, MSP is known as "MOS-Sidewall-Plate." "MOS" refers to the MOS structure in the deep trench 120. "Sidewall" refers to the oxide 122 on the sidewall of the deep trench 120, where the oxide 122 acting as a "plate". These two structures, PiN and MSP are merged together in the single rectifier device 100.

Figure 1B:
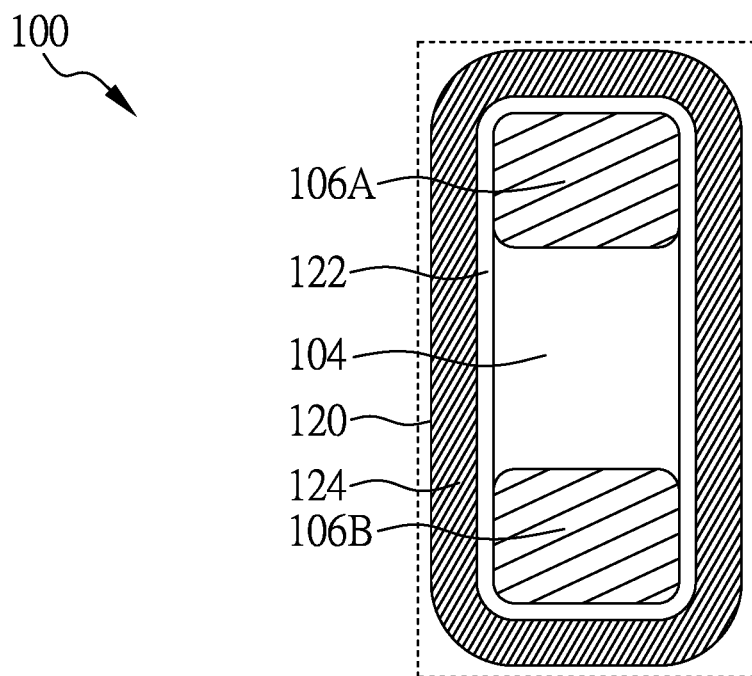
FIG. 1B illustrates a top surface view of the FIG. 1A rectifier, according to one or more embodiments.

FIG. 1B illustrates a top surface view of the rectifier device 100, according to an embodiment. The two P$^+$ edge contact regions 106 A&B are in rectangular shape with round corners and inside the enclosed deep trench structure 120. Other shapes, such as oval, square, round or hexagon may also be contemplated. The round corner or even round shape P$^+$ edge contact regions 106 may be preferred to reduce edge field. Similarly, although the enclosed deep trench structure 120 is shown in rectangular shape with round corners to reduce edge field, other shapes may be contemplated as well such as oval, round or square. The other parts of the device 100 such as metal 108 and parts outside the enclosed deep trench structure 120 are not drawn but shown as dash line. A structure of an enclosed trench that surrounds or encloses a P-N junction is called "Junction All Around" (JAA). In FIG. 1B, the structure of the deep trench 120 that encloses the P-N junctions between P$^+$ edge contact regions 106A&B and N$^-$ epitaxial drift region 104 is an example of "Junction All Around" structure. The JAA concept will be used in other embodiments throughout this disclosure.

During forward bias, the gate 140 is applied positive voltage, and drain 142 and source 144 are applied negative voltage. As a result, current flow from P$^+$ edge contact regions 106A&B through N$^-$ Drift region 104 to N$^+$ substrate 102. The structure of P$^+$ edge contact regions 106 in device 100 help reduce resistance in the device, and hence increase current density.

Figure 1C:
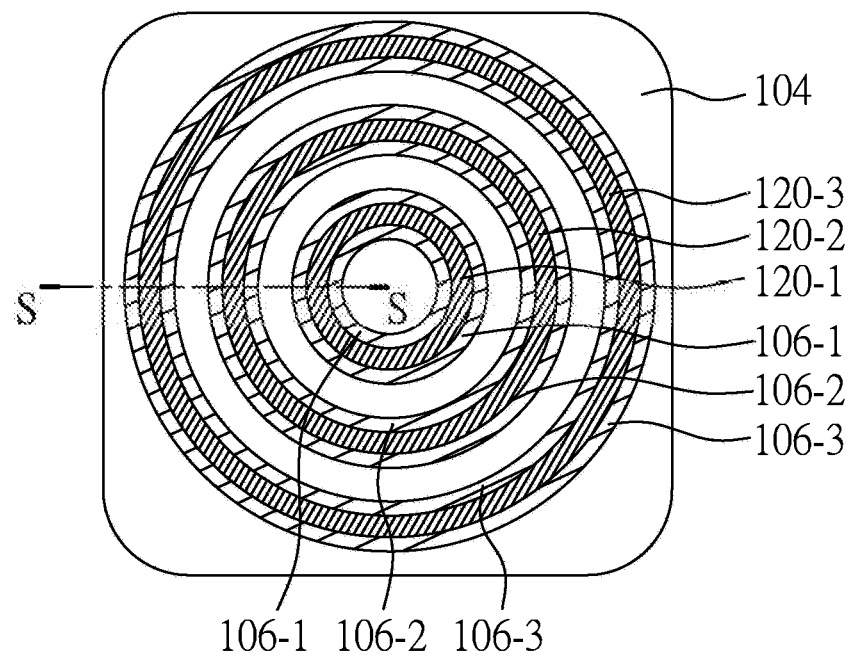
FIG. 1C illustrates a top surface view of another embodiment of the FIG. 1 rectifier, according to one or more embodiments.
Figure 1D:
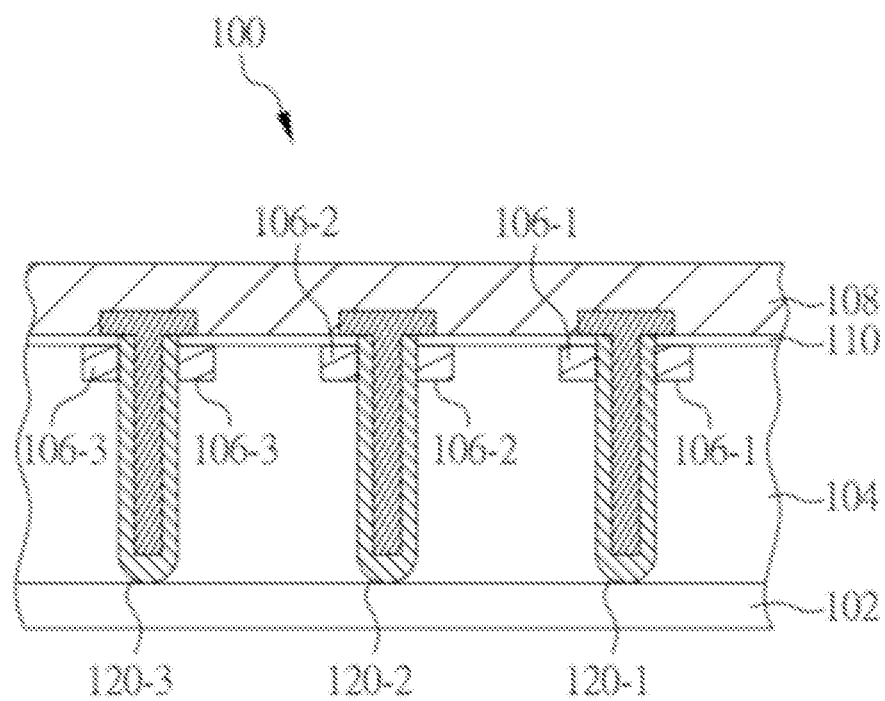
FIG. 1D illustrates a cross-sectional view of the embodiment in FIG. 1C.

FIG. 1C illustrates a top surface view of another embodiment of device 100 with multiple enclosed deep trenches. In this figure, there are three ring-shape deep trenches 120-1, 120-2 and 120-3. There are also three ring-shape P$^+$ edge contact regions 106-1, 106-2 and 106-3 deposed on the top surface of N$^-$ Drift region 104. Each ring-shape deep trench is etched into a corresponding ring-shape P$^+$ edge contact region that covers both inner and outer rim of its deep trench, and then further into N$^-$ epitaxial drift region 104 as shown in FIG. 1C. For example, trench 120-1 is etched into P$^+$ edge contact regions 106-1 which is a thicker ring, and trench 120-2 is etched into P$^+$ edge contact regions 106-2, and so on. These deep trenches are evenly spaced with the distance between two neighboring trenches, for example deep trenches 120-1 and 120-2, about 1 um. All the trenches in this embodiment are in ring shape to reduce edge field effect, although other shapes may be contemplated, for example rectangle, square, oval, etc. The number of deep trenches 120 may vary. The device with multiple deep trenches can greatly improve breakdown voltage. Now, referring to FIG. 1D, which illustrates a cross-sectional view taken along the line S-S of the embodiment in FIG. 1C. This embodiment has three ring-shape deep trenches 120-1, 120-2 and 120-3, and each has a corresponding P$^+$ edge contact region 106-1, 106-2 and 106-3 as described above in this paragraph about its manufacturing process.

Going back to FIG. 1A, when device 100 operates under reverse bias, the gate 140 is applied with negative voltage while the source is applied with positive voltage. As a result, the depletion regions 130 formed around the trench structure 120. In rectifier device 100, the N$^-$ epitaxial drift region 104 can be made thinner than a regular rectifier to reduce the effective resistance, and at the same time allows the deep trench structure 120 to reach its bottom easier with lower cost. The benefit of this combination allows rectifier device 100 to sustain high reverse bias voltage up to 2,000 V with very low leakage current because the depletion regions 130 formed around the trench structure 120 can easily pinch off and prevent leakage current. Compared to typical Epi and trench relation, which, for example, the lighter the doping of N$^-$ epitaxial region, the deeper a trench is needed to achieve the same pinch-off effect, the device 100 has an advantage. The location and structure of P$^+$ edge contact regions 106 also help form depletion regions easier.

Figure 2A:
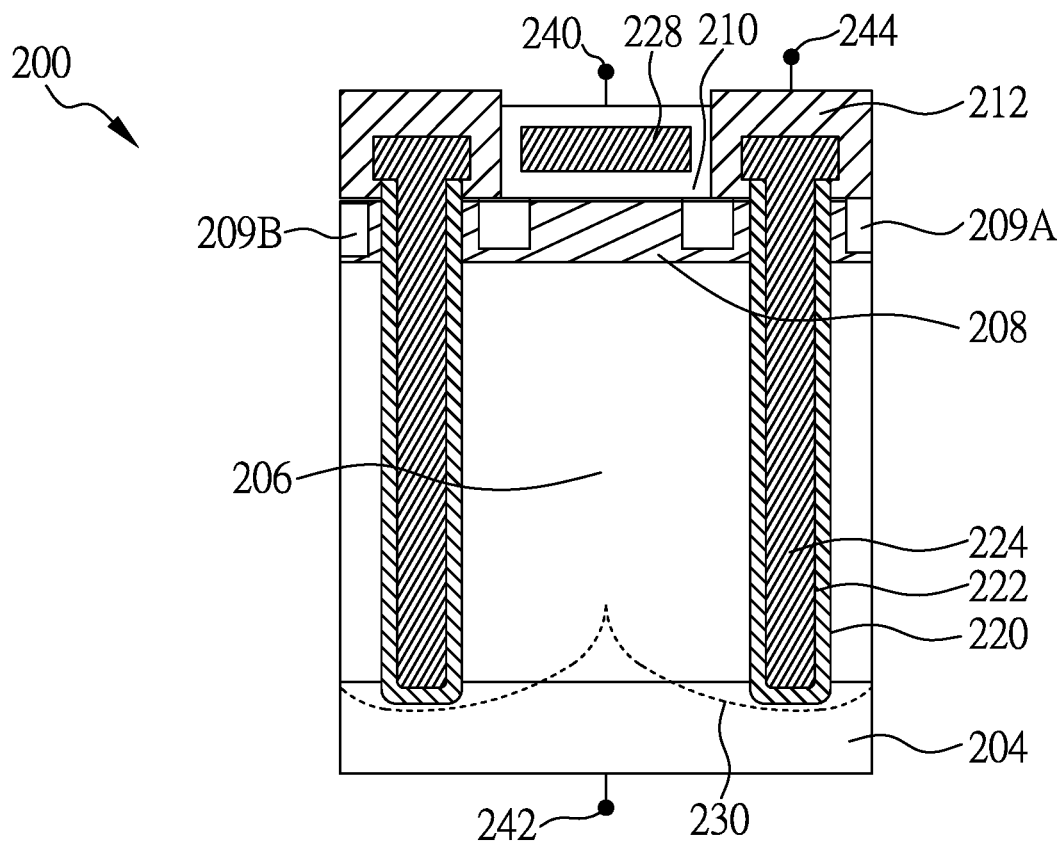
FIG. 2A illustrates a cross-sectional view of a deep trench surrounded MOSFET with planar MOS gate, according to one or more embodiments.

FIG. 2A illustrates a cross-sectional view of device 200, a deep trench surrounded MOSFET with planar MOS gate, according to an embodiment. This MOSFET device 200 has a layer of heavily doped N-type semiconductor layer 204 acting as a low conducting substrate for this device 200. The doping concentration of N$^+$ layer 204 is around $1\times10^{18}$/cm$^3$.

A layer of lightly doped N type epitaxial semiconductor layer 206 is deposed on top of N$^+$ layer 204 to act as drift region for this device 200, and its doping concentration is between $1\times10^{14}$-$1\times10^{16}$/cm$^3$. A P-Well channel region 208 is deposed at the top surface of the N$^-$ epitaxial layer 206 by implant with doping concentration between $1\times10^{16}$-$1\times10^{17}$/cm$^3$. At both left and right sides of the top portion of P-Well channel region 208, N$^+$ source regions 209A and 209B are added, respectively, with doping concentration around $1\times10^{18}$/cm$^3$ to act as source for device 200.

Further in FIG. 2A, in one or more embodiment, an enclosed deep trench structure 220 serving as an operating (or active) trench is etched around the periphery of the MOSFET device 200, extending from the top surface of N$^+$ source regions 209A and 209B down to at least more than half of the depth of N$^-$ epitaxial layer 206, and as far as N$^+$ layer 204. Thus, the deep trench 220 is possible to control or has impact on the N$^+$ area 204. The enclosed deep trench structure 220 may be etched in rectangular, oval or round shape. On the sidewall of the enclosed deep trench structure 220, thermal oxide 222 is grown on its surface. Then polysilicon 224 is used to fill the enclosed deep trench structure 220, and added to the top surface of device 200 to form a planar electrode 228. A Passivation oxide layer 210 is then deposited on top of the deep trench 220 and the planar electrode 228 to act as insulator and planar gate. A metal layer 212 is deposed on top of the Passivation oxide layer 210 and cover the top of trench 220.

Figure 2B:
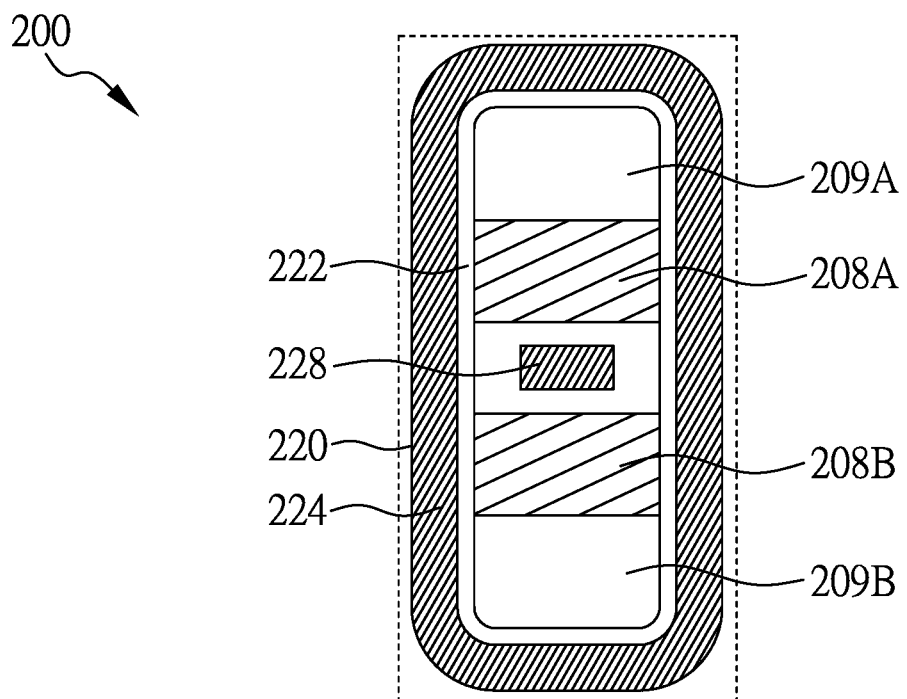
FIG. 2B illustrates a top surface view of the FIG. 2A MOSFET, according to one or more embodiments.

FIG. 2B illustrates a top surface view of the MOSFET device 200, according to an embodiment. A rectangular shape deep trench 220 with round corners surrounds N$^+$ regions 209A&B and P-Well channel regions 208 to form a JAA structure. The top portion of device 200, including the P-Well channel layer 208, N$^+$ semiconductor regions 209A &B and N$^-$ epitaxial layer 206, together acts as a planar N-channel MOS when a forward bias voltage is applied to the electrode 228. In FIG. 2A, when under forward bias, current flows from N$^+$ regions 209A &B through P-Well channel layer 208 to N$^-$ epitaxial layer 206 (drift region).

Figure 2C:
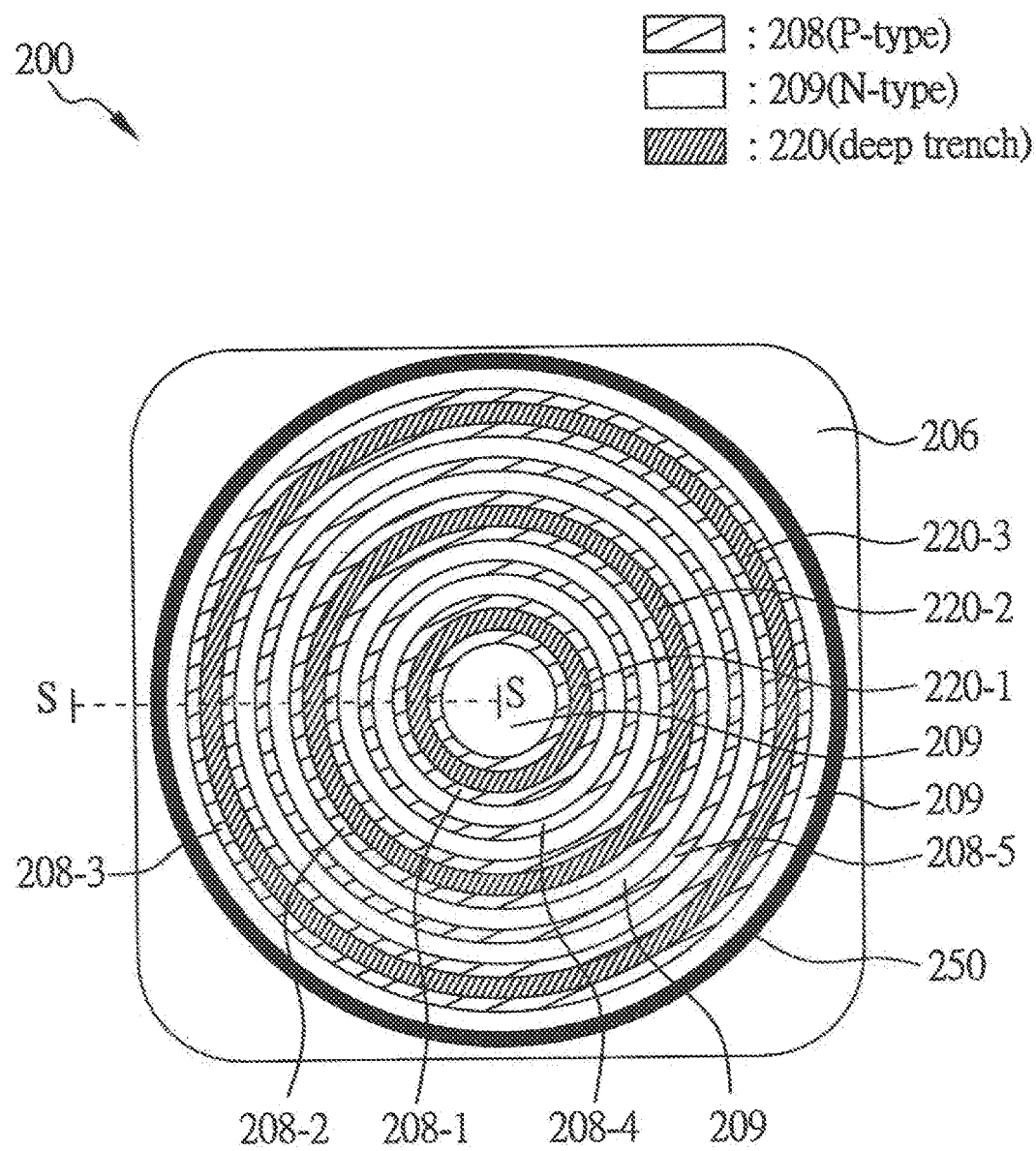
FIG. 2C illustrates a top surface view of another embodiment of the FIG. 2A MOSFET with multiple enclosed deep trenches, according to one or more embodiments.

FIG. 2C illustrates a top surface view of another embodiment of device 200 with multiple enclosed deep trenches. In this figure, there are three ring-shape deep trenches 220-1, 220-2 and 220-3 (collectively called 220). Each deep trench 220 is etched into a corresponding and thicker ring-shape P-Well Channel Layer (208-1, 2 & 3, right below trenches 220) with N$^+$ regions 209 surrounding each P layer ring 208 to form a JAA structure. Two additional ring-shape P-Well Channel Layer 208-4&5 are deposed between deep trenches to serve as MOS channel. These trenches are evenly spaced with the distance between any two neighboring trenches about 1 um. All the trenches in this embodiment are in ring shape to reduce edge field effect, although other shapes may be contemplated, for example rectangle, square, oval, etc. The number of deep trenches 220 may vary. A ring-shape guard ring 250 with oxide is added at the boundary of this MOSFET device 200. Similarly, this device 200 with multiple deep trenches can greatly improve breakdown voltage.

Figure 2D:
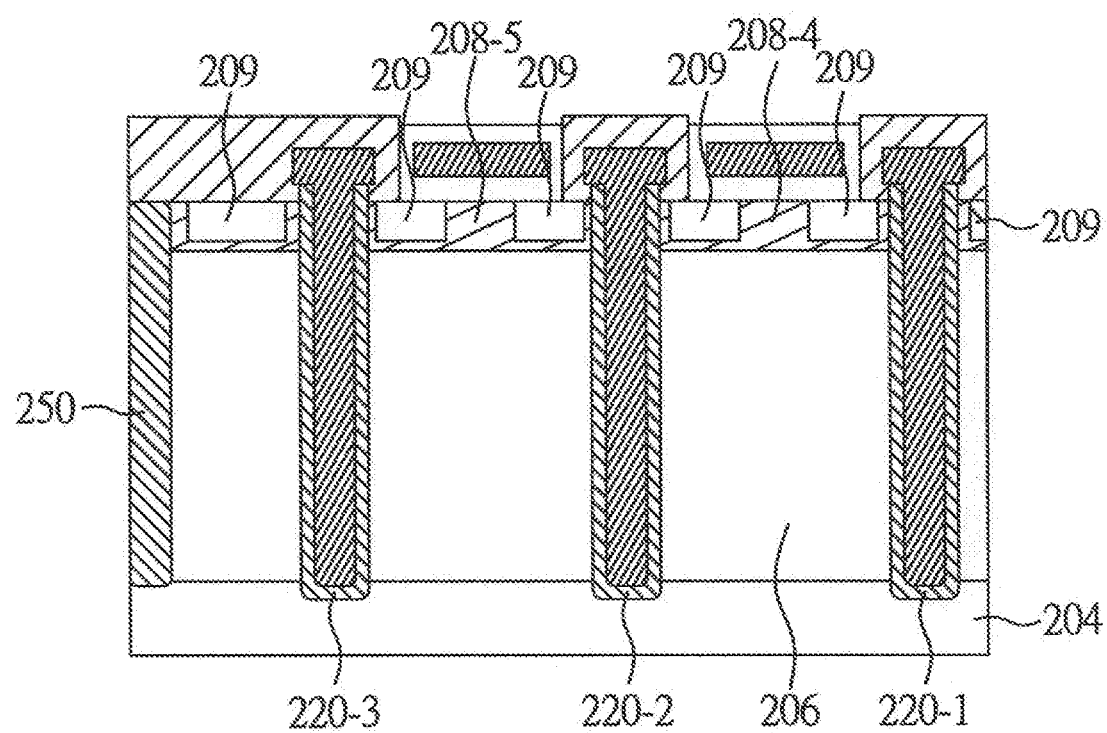
FIG. 2D illustrates a cross-sectional view of the embodiment in FIG. 2C.

FIG. 2D illustrates a cross-sectional view taken along the line S-S of the embodiment in FIG. 2C. This embodiment has three ring-shape deep trenches 220-1, 220-2 and 220-3, ring-shape P-well channel layer 208 and N$^+$ region 209 surrounding each P layer ring 208 as described above about its manufacturing process. The each of the deep trenches 220, P-well channel layer 208 and N$^+$ regions 209 have the same cross-sectional structure as described in FIG. 2A.

In FIG. 2A, the N$^-$ epitaxial layer 206 of the device 200 is made thinner than a regular MOSFET to reduce the effective resistance, and at the same time it allows the deep trench structure 220 to reach its bottom easier and beyond into N$^+$ layer 204 with lower cost. The benefit of this combination allows the device 200 to sustain high reverse bias voltage up to 2,000 V with very low leakage because the depletion regions 230 formed around the trench structure 220 can easily pinch off and prevent leakage current.

Figure 3A:
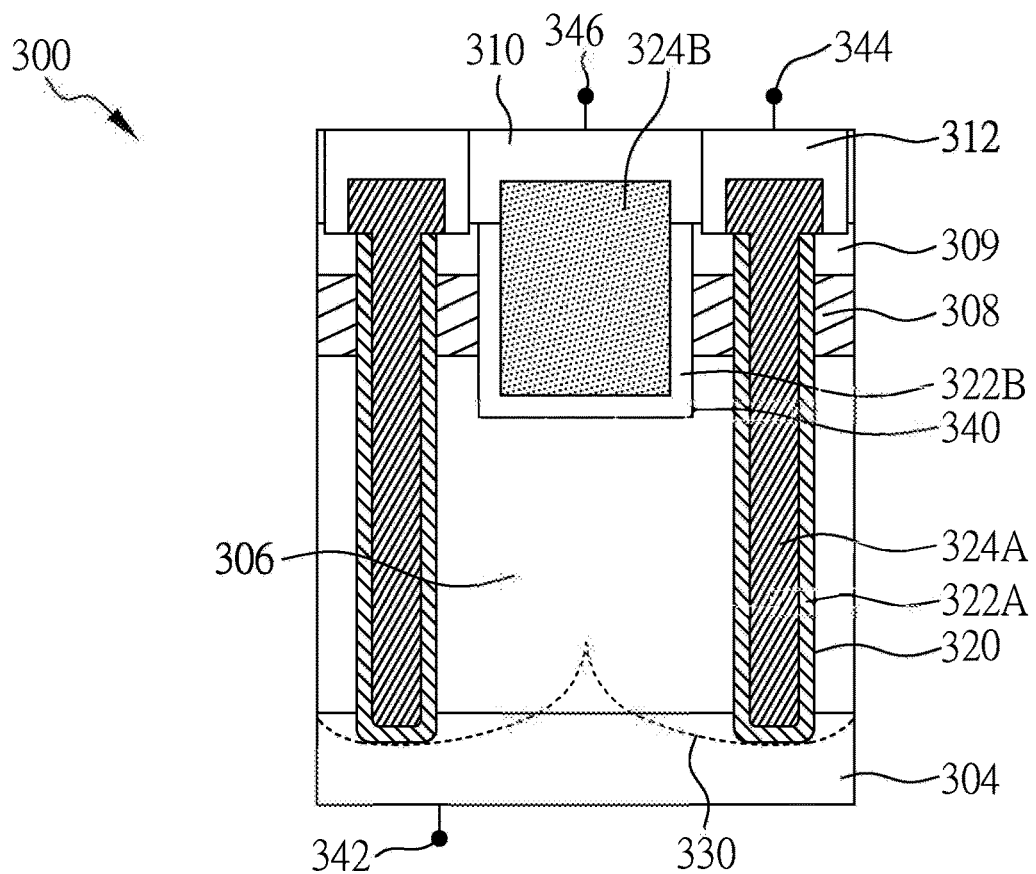
FIG. 3A illustrates a cross-sectional view of a double trench MOSFET with trench gate, according to one or more embodiments.

FIG. 3A illustrates a cross-sectional view of MOSFET device 300, a double trench MOSFET with trench gate, according to an embodiment. The device has a deep trench 320 and a center shallow trench 340. The deep trench 320 may also be viewed as two horizontal deep trenches on the left and right sides of the center shallow trench 340. The first two bottom layers of device 300, similar to the bottom two layers of device 200, are N$^+$ layer 304 acting as field stop and N$^-$ epitaxial layer 306 acting as drift region. A P$^-$ MOS channel layer 308 is deposed above the N$^-$ epitaxial layer 306. On top of P-MOS channel layer 308, a heavily doped N$^+$ semiconductor layer 309 is added to act as source of device 300. The doping concentration of these N-type and P-type semiconductor layers are similar to the counterparts in device 200 of FIG. 2.

Further in FIG. 3A, in one or more embodiment, an enclosed deep trench structure 320 is etched around the periphery of the MOSFET device 300, extending from the top surface of N$^+$ semiconductor layer 309 down to at least more than half of the depth of N$^-$ epitaxial layer 306, and as far as N$^+$ layer 304. In addition, a shallow trench structure 340 is etched in the center of the device 300, extending from the top surface of N$^+$ semiconductor regions 309 down to the upper portion of N$^-$ epitaxial layer 306. In an embodiment, the depth of deep trench 320 is around several times (e.g. four to five times) the depth of shallow trench 340. The width of the center shallow trench 340 is around 1 um. The Mesa width is roughly the same order as the depth of the deep trench 320. The sidewall of enclosed deep trench structure 320 is coated with grown thermal oxide or CVD deposited oxide 322A, and then filled with polysilicon 324A. The sidewall of the shallow trench structure 340 is coated with grown thermal oxide 322B, and then filled with polysilicon 324B. The second polysilicon 324B acts as a gate electrode (or called trench gate). After creating both deep trench 320 and shallow trench 340, a Passivation oxide layer 310 is deposited on top of both trenches 320 and 340 to act as insulator. A metal region 312 is added on top of the passivation oxide layer 310.

Figure 3B:
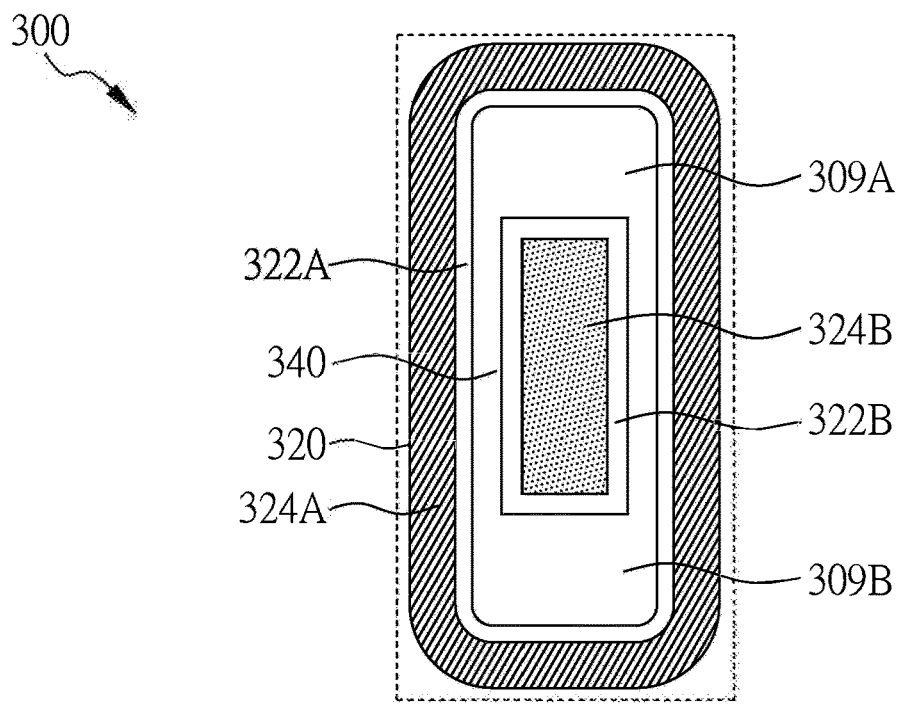
FIG. 3B illustrates a top surface view of the FIG. 3A MOSFET, according to one or more embodiments.

FIG. 3B illustrates a top surface view of the MOSFET device 300, according to an embodiment. The shallow trench 340 is in the middle of N$^+$ semiconductor layer 309, which has a P$^-$ MOS layer 308 below serving as MOS sidewall channel. Both layers 308 and 309 are surrounded by the enclosed deep trench 320 to form a JAA structure. Although the enclosed deep trench 320 and the shallow trench 340 are in rectangular shape, they may be in other shapes such as square, oval or round. The passivation oxide 310 and metal layer 312 are not shown in this figure for simplicity and clarity. The other parts of device 300 outside the enclosed deep trench 320 are not drawn but shown as dash line.

Figure 3C:
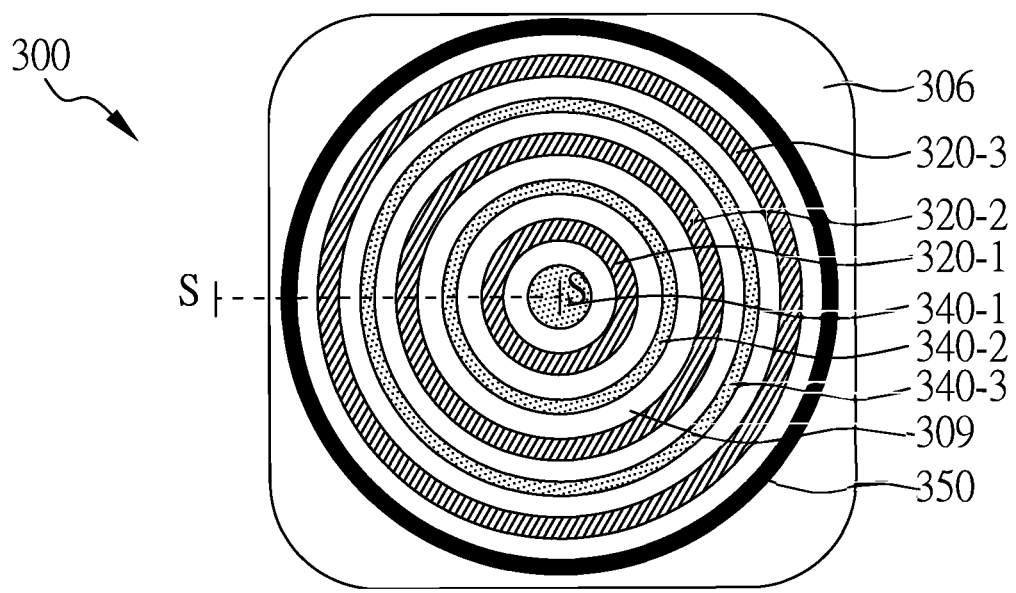
FIG. 3C illustrates a top view of another embodiment of the FIG. 3A MOSFET with multiple deep trenches, specifically the first layer its vertical P-N junction, according to one or more embodiments.
Figure 3D:
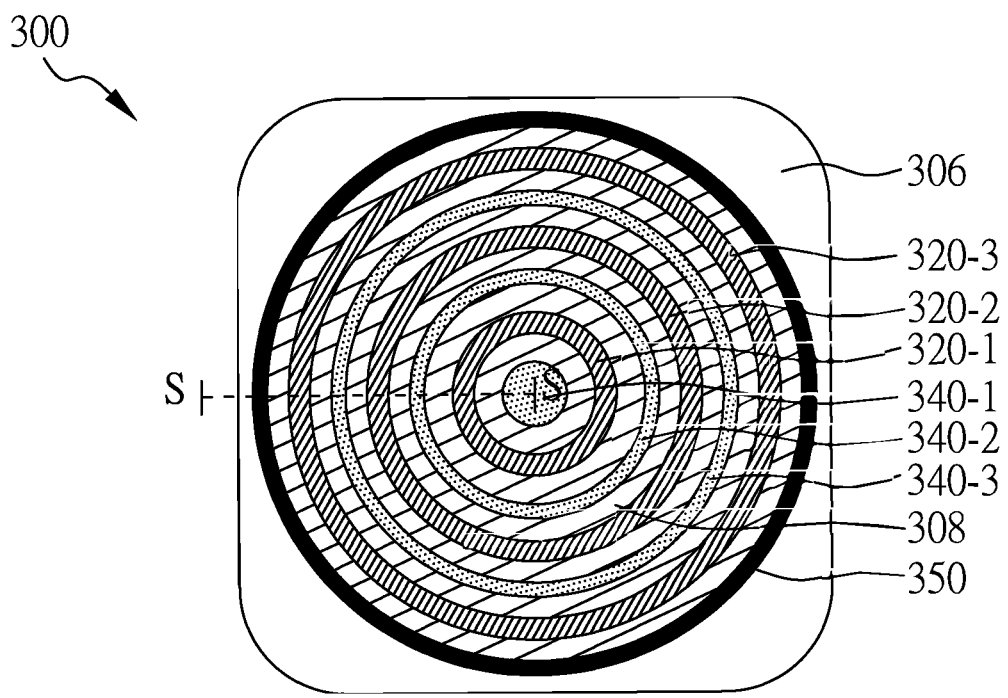
FIG. 3D illustrates a top view of another embodiment of the FIG. 3A MOSFET with multiple deep trenches, specifically the second layer its vertical P-N junction, according to one or more embodiments.

FIGS. 3C and 3D illustrate top views of another embodiment of device 300 with multiple deep trenches. In particular, FIG. 3C depicts the upper N$^+$ layer 309, and FIG. 3D depicts the middle P$^-$ channel layer 308 to better illustrate the JAA structure because one layer fully overlaps another as described earlier. In both figures, there are three ring-shape deep trenches 320-1, 320-2 and 320-3 (collectively called 220), and three shallow trenches, 340-1 (a round structure at the center), and 340-2 and 340-3 (two ring-shape), where each shallow trench is deposed between two deep trenches to act as trench gate. All trenches 320 and 340 are first etched into a N⁺ layer 309 shown in FIG. 3C, then down to P⁻ channel layer 308 shown in FIG. 3D, and further into N– Epi Base Region 306 (not shown). N⁺ layer 309 and P⁻ layer 308 form the vertical P-N junction surrounded by the deep trenches 320. FIG. 3D shows that P⁻ layer 308 are on both sides of each deep trench to act as MOS sidewall channel. All the trenches in this embodiment are in ring shape to reduce edge field effect, although other shapes may be contemplated, for example rectangle, square, oval, etc. The number of deep and shallow trenches may vary. A guard ring 350 with oxide is added at the boundary of this MOSFET device 300. Similarly, this device 300 with multiple deep trenches can greatly improve breakdown voltage.

Figure 3E:
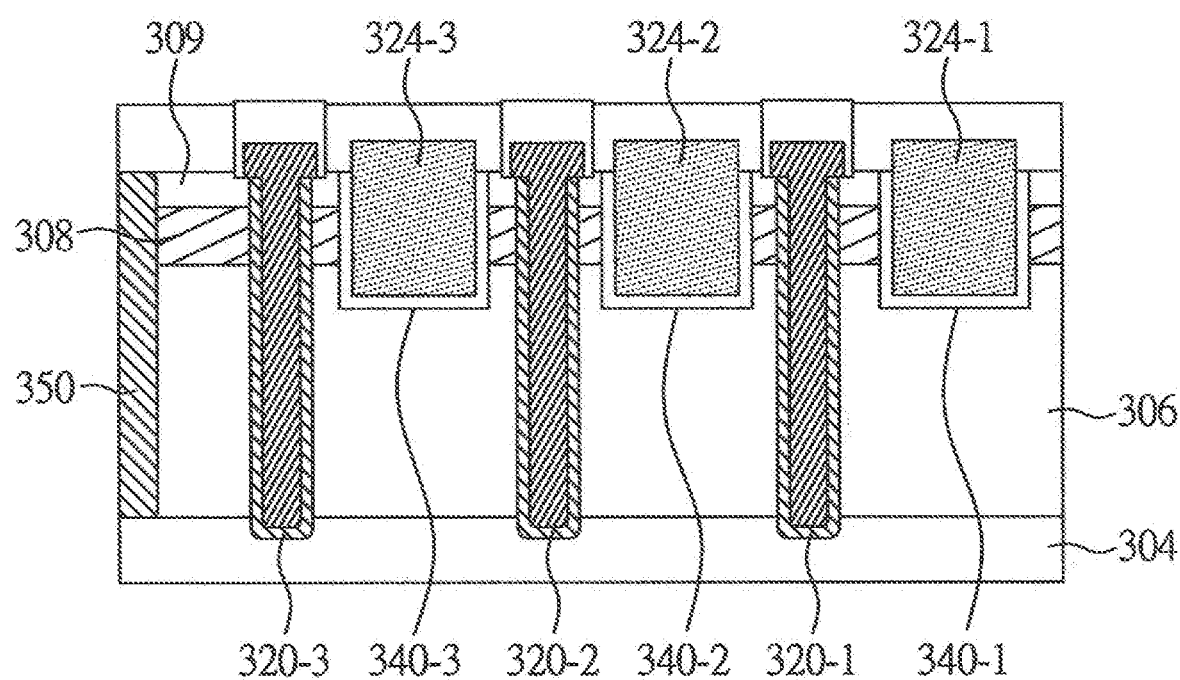
FIG. 3E illustrates a cross-sectional view of the embodiment in FIG. 3C and FIG. 3D.

FIG. 3E illustrates a cross-sectional view taken along the line S-S of the embodiments in FIGS. 3C and 3D. Each of the deep trenches 320, each of the shallow trenches 340, N⁺ layer 309 and P⁻ channel layer 308 has the same cross-sectional structure as described in FIG. 3A.

Returning to FIG. 3A. The vertical structure of device 300 is equivalent to a JAA structure which is composed of deep trench 320, N⁺ 309, P⁺ 308 and N⁻ 306. Because JAA structure can modify inner MOS device field and sustain higher voltage with thinner N⁻ Epi layer, therefore device 300 has lower conductivity with similar breakdown voltage when compared to regular MOS device during forward bias. During forward bias, the gate 346 and source 344 are applied positive voltage while drain 342 is applied negative voltage. This allows the regions of N⁺ 309, P⁻ 308 and N⁻ 306 to act as vertical MOS. This vertical MOS can be turned on with a grounded back bias coupled from the deep trench JAA structure, and is better controlled by the JAA structure than non-JAA structure. The current flows from metal 312 through N⁺ 309 and P⁻ channel layer 308, then down to N⁺ substrate 304.

[Reverse bias operation] Similar to device 200 discussed earlier, in FIG. 3A, the combination of thinner N⁻ epitaxial layer 306 and very deep enclosed trench 320 allows the device 300 to sustain high reverse bias voltage up to 2,000 V (i.e. gate 346 in negative voltage and drain 342 in positive voltage) with very low leakage because the depletion regions 330 formed around the trench structure 320 can easily pinch off and prevent leakage current.

In summary, the goal of the above mentioned embodiments is to create devices that have comparable performance as regular rectifier and MOS while reducing Trr (reverse recovery time), increasing breakdown voltage, and reducing body resistivity. These embodiments have following important features. First, they use pinched channel to increase breakdown voltage and reduce epitaxial thickness (and cost) of the high voltage diode manufacture (aka TMBS Schottky structure, to pinch off diode Mesa to modify breakdown field distribution). Second, they reduce Vif (total built-in potential) as a result of lower body resistance, by adapting a thinner N– Epi, and additionally by turning on sidewall MOS at forward bias. Third, they reduce Trr and improve diode turn-off speed by using sidewall oxide surface as recombination center to avoid traditional contaminated deep trap doping (like Au, Pt) process and allow conventional MOS foundry to do rectifier fabrication. Finally, the sidewall MOS formation on deep trenches and N⁻ Epi dopant and depth selection are important factors for high voltage design. Typically, for low voltage application lower than 30V, the deep trench is around 5~6 um. However, this disclosure can achieve very high voltage application (e.g. 1,000V to 2,000V) by using one ore more ring-shape deep trenches (for example, up to 20 um) with thick oxide on their sidewalls. The cell MESA dimension can limit the maximum depletion length and depletion region or layer formation, and hence influence subsequent sidewall MOS inversion layer formation on the sidewall of deep trenches. This inversion layer formation can change sidewall conductivity greatly and further modify the body resistance of JAA structure. A proper combination of oxide thickness, Mesa width, and bulk Epi concentration and depth are all important contributing factors.

Definitions and Other Embodiments

This specification includes references to "one embodiment", "an embodiment", and "an alternative embodiment". The appearance of the same phrase in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must).

"Comprising" or "Including." These terms are open-ended. As used in the appended claims, this term does not foreclose additional structure or steps. Consider a claim that recites: "A computing system comprising a physical memory . . . " Such a claim does not foreclose the computing system from including additional components (e.g., a cache, a memory controller).

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

What is claimed is:
1. A MOSFET, comprising:
a first n-type semiconductor layer;
a second n-type epitaxial semiconductor layer with lower doping concentration but larger depth than that of the first n-type semiconductor layer, deposed on top of the first n-type semiconductor layer;
a p-type semiconductor layer deposed on the top surface of the second n-type semiconductor layer;
a metal layer deposed above the p-type semiconductor layer;
at least two enclosed operating deep trenches in concentric continuous ring circles
comprising a first deep trench and a second deep trench, wherein
the first operating deep trench etched from the top of the p-type semiconductor layer down to the interface of the first n-type semiconductor layer and the second n-type semiconductor layer;
the second operating deep trench etched from the top of the p-type semiconductor layer down to the interface of the first n-type semiconductor layer and the sec- ond n-type semiconductor layer, and the first operating deep trench has smaller radius than the second operating deep trench;

a first set of two third n-type semiconductor in continuous ring circles deposed in the upper part of the p-type semiconductor layer and being adjacent to both inner-side and outer-side of the first enclosed deep trench but not in direct contact with the first enclosed deep trench; and a second set of two third n-type semiconductor in continuous ring circles deposed in the upper part of the p-type semiconductor layer and being adjacent to both inner-side and outer-side of the second enclosed deep trench but not in direct contact with the second enclosed deep trench.

2. The MOSFET device of claim 1, wherein the at least two enclosed operating deep trenches have oxide coating on their sidewalls and bottom surfaces, and a polysilicon layer filling their centers and connected to the metal layer for operation to form a MOS-Sidewall-Plate structure.

3. The MOSFET device of claim 1, wherein the first-set outer-side third n-type semiconductor ring circle, which has smaller radius than that of the second-set inner-side third n-type semiconductor ring circle, is spaced apart from the second-set inner-side third n-type semiconductor ring circle, such that leaving the p-type semiconductor in between.

4. The MOSFET device of claim 1, further comprising a third enclosed operating deep trench in concentric continuous ring etched from the top of the p-type semiconductor layer down to the interface of the first n-type semiconductor layer and the second-type semiconductor layer, wherein the third operating deep trench is between the first operating deep trench and second operating deep trench with substantially the same distance to both the first operating deep trench and second operating deep trench.

5. The MOSFET device of claim 1, further comprising an enclosed non-operating deep trench in concentric ring circle filled with only oxide and located as the outermost ring circle of the device.

6. The MOSFET device of claim 4, further comprising a third set of two third n-type semiconductor in continuous ring circles deposed in the upper part of the p-type semiconductor layer and being adjacent to both inner-side and outer-side of the third enclosed deep trench but not in direct contact with the third enclosed deep trench.

7. The MOSFET device of claim 5, wherein the enclosed non-operating deep trench in concentric ring circle is the outermost deep trench of the MOSFET device.

8. The MOSFET device of claim 7, wherein all deep trenches except the outermost deep trench are operating trenches having MOS-Sidewall-Plate structure and in concentric continuous ring circles.

9. The MOSFET device of claim 1, wherein the first and second operating deep trenches extend into the first n-type semiconductor layer.

10. The MOSFET device of claim 1, further comprising a planar electrode deposed above the metal layer and between the first and the second enclosed deep trenches.

* * * * *